(12) United States Patent
Terzioglu et al.

(10) Patent No.: US 7,852,113 B2
(45) Date of Patent: Dec. 14, 2010

(54) LEAKAGE CONTROL

(75) Inventors: Esin Terzioglu, Aliso Viejo, CA (US); Gil I. Winograd, Aliso Viejo, CA (US)

(73) Assignee: Novelics, LLC., Laguna Hills, CA (US)

( * ) Notice: Subject to any disclaimer, the term of this patent is extended or adjusted under 35 U.S.C. 154(b) by 36 days.

(21) Appl. No.: 12/326,086

(22) Filed: Dec. 1, 2008

(65) Prior Publication Data

US 2009/0189685 A1    Jul. 30, 2009

Related U.S. Application Data (63) Continuation-in-part of application No. 12/144,622, filed on Jun. 23, 2008, now Pat. No. 7,728,621, which is a continuation-in-part of application No. 11/857,133, filed on Sep. 18, 2007, now abandoned, which is a continuation of application No. 11/301,236, filed on Dec. 12, 2005, now Pat. No. 7,271,615.

(60) Provisional application No. 60/708,729, filed on Aug. 16, 2005, provisional application No. 60/945,714, filed on Jun. 22, 2007, provisional application No. 60/990,967, filed on Nov. 29, 2007.

(51) Int. Cl.
*H03K 17/16* (2006.01)
*H03K 19/003* (2006.01)

(52) U.S. Cl. .................. 326/33; 326/112; 326/119
(58) Field of Classification Search .................. None
See application file for complete search history.

(56) References Cited

U.S. PATENT DOCUMENTS

| 6,166,985 | A   | * | 12/2000 | McDaniel et al. ...... 365/230.06 |
| 6,307,396 | B1  | * | 10/2001 | Mulatti et al. ................. 326/71 |
| 7,227,804 | B1  | * | 6/2007  | Kothandaraman et al. ... 365/229 |
| 2002/0158665 | A1 |  | 10/2002 | Ye et al. |
| 2005/0146948 | A1 |  | 7/2005  | Hose, Jr. et al. |

FOREIGN PATENT DOCUMENTS

WO    WO 00/67380    11/2000

* cited by examiner

*Primary Examiner*—Anh Q Tran
(74) *Attorney, Agent, or Firm*—Haynes & Boone, LLP.

(57) ABSTRACT

In one embodiment, a leakage reduction circuit is provided that includes: a virtual power supply node; a first PMOS transistor coupled between the virtual power supply node and a power supply node; a second PMOS transistor having a source coupled to the power supply node; and a native NMOS transistor coupled between a drain of the second PMOS transistor and the virtual power supply node, the native NMOS transistor having a gate driven by the power supply node.

4 Claims, 8 Drawing Sheets

LEAKAGE CONTROL

RELATED APPLICATION

This application is a continuation-in-part of U.S. application Ser. No. 12/144,622, filed Jun. 23, 2008, now U.S. Pat. No. 7,728,621 which is a continuation-in-part of U.S. application Ser. No. 11/857,133, filed Sep. 18, 2007, now abandoned which is a continuation of U.S. application Ser. No. 11/301,236, filed Dec. 12, 2005, now U.S. Pat. No. 7,271,615 which claims the benefit of U.S. Provisional Application No. 60/708,729 filed Aug. 16, 2005. In addition, this application claims the benefit of U.S. Provisional Application No. 60/945,714, filed Jun. 22, 2007 and also claims the benefit of U.S. Provisional Application No. 60/990,967, filed Nov. 29, 2007.

The present invention relates to integrated circuits, and more particularly to integrated circuits having reduced leakage current.

As circuit dimensions continue to shrink, power dissipation due to leakage current is becoming an ever greater problem. Leakage-current-induced power dissipation in mobile devices such as cell phones reduces battery life, thereby inconveniencing users by requiring more frequent re-charges. Ideally, a transistor in a digital integrated circuit acts like a switch, being either in a conductive (on) state or a non-conductive (off) state. However, transistors always conduct some amount of leakage current in the off state. As process technology advances into the 90 nanometer (nm) or 65 nm dimensions and smaller, the ability to close the channel between source and drain in a transistor weakens such that "subthreshold" leakage current continues to flow between the source and drain even when the transistor is turned solidly off.

Some approaches to mitigate subthreshold leakage current include lengthening the channel. However, that approach reduces achievable component density, thereby obviating one of the major advantages of modern process technology. Rather than lengthen the channel, other approaches use multiple gates, which increases process complexity and still reduces component density. Accordingly, there is a need in the art for integrated circuits having improved leakage current reduction.

SUMMARY

This section summarizes some features of the invention. Other features are described in the subsequent sections.

In accordance with an aspect of the invention, a leakage reduction circuit is provided that includes: a virtual power supply node; a first PMOS transistor coupled between the virtual power supply node and a power supply node; a second PMOS transistor having a source coupled to the power supply node; and a native NMOS transistor coupled between a drain of the second PMOS transistor and the virtual power supply node, the native NMOS transistor having a gate driven by the power supply node.

The invention is not limited to the features and advantages described above. Other features are described below. The invention is defined by the appended claims.

DETAILED DESCRIPTION

Reference will now be made in detail to one or more embodiments of the invention. While the invention will be described with respect to these embodiments, it should be understood that the invention is not limited to any particular embodiment. On the contrary, the invention includes alternatives, modifications, and equivalents as may come within the spirit and scope of the appended claims. Furthermore, in the following description, numerous specific details are set forth to provide a thorough understanding of the invention. The invention may be practiced without some or all of these specific details. In other instances, well-known structures and principles of operation have not been described in detail to avoid obscuring the invention.

Conventional integrated circuits typically include circuit arrays in which only a few (typically just one) circuit is active at any given time. For example, memories require address decoders such as row-decoders or wordline-decoders wherein only a single decoder is active depending upon the decoded address. Generally, such circuits include a set of NMOS transistors sharing a common source node tied to a local ground (VSS) and sharing a common drain node tied to VDD. The gate voltages (Vg) of the NMOS transistors in the sets are driven to VSS if the corresponding circuit in which they are incorporated is inactive. If a circuit is active, however, Vg may either be held to VDD or switched periodically to VDD. Similarly, such circuits also include a set of PMOS transistors sharing a common source node tied to VDD and sharing a common drain node tied to VSS. The gate voltages (Vg) of the PMOS transistors in a set in an inactive circuit are driven to VDD. If a circuit is active, however, Vg may either be held to VSS or switched periodically to VSS.

Given such a circuit array architecture, the potential for large amounts of leakage current is apparent. If the circuits are all inactive, their sets of NMOS and PMOS transistors are turned off but have drain-to-source voltages (Vds) equaling VDD. Thus, subthreshold leakage current will flow through these sets of transistors. To stem this flow of leakage current, one or both sets of the NMOS and PMOS transistors may be modified to significantly reduce subthreshold and other types of leakage current as will be explained further herein. For example, turning now to FIG. 1, consider the array of circuits 100 that include sets of NMOS transistors 105 operated as described above. For example, circuits 100 may be row-decoders, wordline-decoders, or any other type of circuit arranged in an array such that one circuit (or a subset of circuits) is active at any given time. The sources of NMOS transistors 105 are tied to a virtual ground 110 that couples to a local ground through NMOS transistors M1 and M2.

Figure 1:
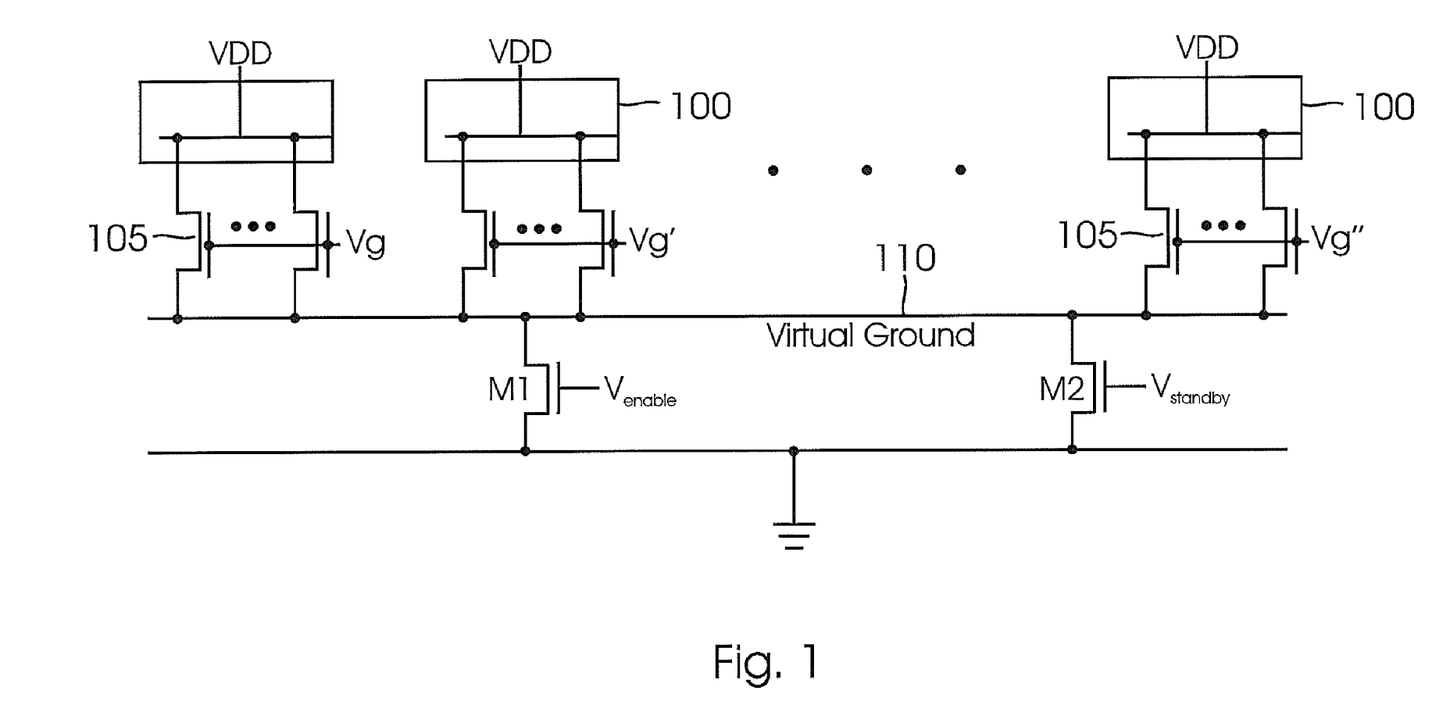
FIG. 1 is a circuit diagram of an array of NMOS transistors with their sources coupled to a virtual ground node controlled for leakage current reduction.

NMOS transistors M1 and M2 are controlled by mode signals $V_{enable}$ and $V_{standby}$, respectively. These mode signals may be asserted appropriately such that a normal mode, a standby mode, and a deep sleep mode of operation are enabled. The normal mode of operation corresponds to normal operation of circuits 100 (i.e., when one or more is active). In the normal mode, $V_{enable}$ is asserted so that M1 is conducting. M1 is sized so that it will easily supply the necessary current during normal operation. For example, M1 may be three times larger than transistors 105. However, should all circuits 100 be inactive and M1 still be conducting, the leakage current losses may be substantial. To prevent such losses, $V_{enable}$ may be de-asserted when circuits 100 are inactive. However, to keep virtual ground 110 from floating too high (such that undesired delay would occur before M1 could drain the excess charge on virtual ground 110 so that normal mode operation could resume), $V_{standby}$ may be asserted in a standby mode of operation if all circuits 100 are inactive. M2 functions as a "chokepoint" to the leakage current flowing through transistors 105 during standby operation. In this fashion, M2 should be sized so as to be relatively weak. For example, in one embodiment, if transistors 105 have a width to length ratio (W/L) of 10/0.13 μm, M2 may have a W/L ratio of 0.3/2 μm. Leakage current from transistors 105 will cause a voltage rise at virtual ground 110 during the standby mode because the leakage current flow is being stymied through M2. It will be appreciated that if delay is not a concern, a more efficient design would exclude M2 and rely on M1 alone to reduce leakage current.

The voltage rise at virtual ground 110 will increase the current flowing through M2 in the standby mode. In a transistor such as M2 that is switched on, the increase in current will be linearly proportional to the increasing voltage at virtual ground 110. However, the gate-to-source voltage (Vgs) for transistors 105 becomes negative as the voltage at virtual ground 110 increases because the gate voltage Vg for transistors 105 is tied to the local ground, not virtual ground 110. Moreover, leakage is further reduced because the threshold voltage Vt for transistors 105 is increased due to the body effect from the rise in potential at virtual ground 110. It may be shown that the subthreshold leakage current through NMOS transistors decreases exponentially for a negative Vgs. Thus, the leakage current through transistors 105 will have an exponential decrease in magnitude during the standby mode. The smaller the on-current for M2, the greater will be the rise in voltage at virtual ground 110 and thus the greater the increase in leakage current reduction. However, the greater the rise in voltage at virtual ground 110, the greater will be the time required to drain the excess charge from virtual ground 110 if normal mode operation is desired. Circuits 100 typically cannot function properly if virtual ground 110 is not virtually grounded during normal operation. Therefore, a tradeoff between leakage current reduction and time to recover for normal mode operation governs the choice of a size (and hence on-current magnitude) for M2.

The deep sleep mode occurs if both $V_{enable}$ and $V_{standby}$ are de-asserted such that the virtual ground floats. In this fashion, the leakage current reduction is maximized. However, the delay necessary to drain excess charge from virtual ground 110 before normal operation may be resumed from a deep sleep mode is greater as compared to a transition from standby mode.

It may be observed that the leakage current reduction benefits provided by transistors M1 and M2 will be diminished if increasing numbers of circuits 100 are active in the normal mode of operation. For example, suppose all circuits 100 are active in the normal mode. Transistor M1 must then be quite massive to supply the necessary current to the switching transistors. To provide an equivalent leakage current reduction using the die area space that would have to be devoted to M1, transistors 105 could simply have their W/L ratio adjusted to reduce their leakage current. M2 need not be so massive, however, if only one or a few circuits are active at any given time in the normal mode of operation.

Figure 2:
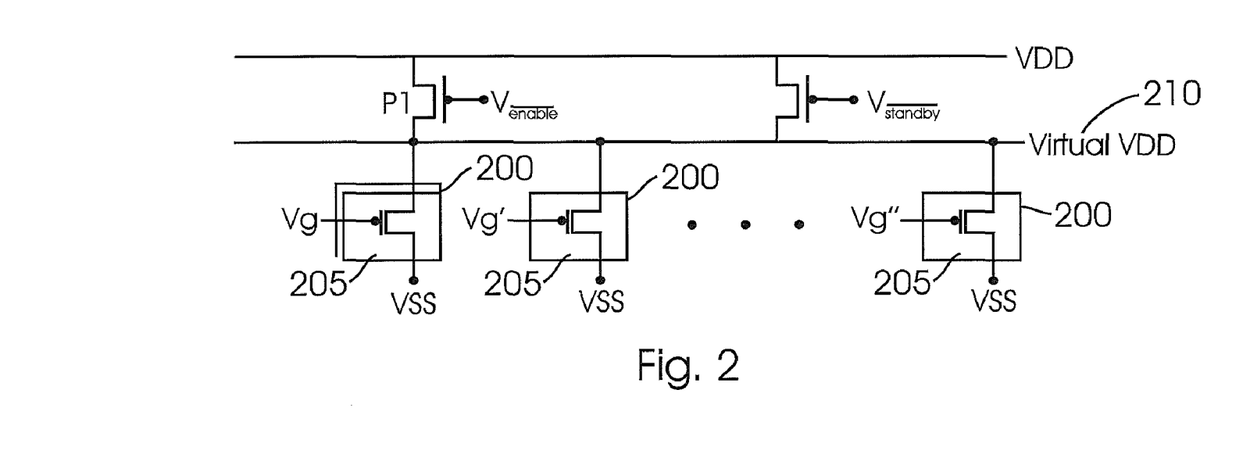
FIG. 2 is a circuit diagram of an array of PMOS transistors with their sources coupled to a virtual VDD node controlled for leakage current reduction.

The leakage current reduction explained with regard to NMOS transistors 105 may be extended to sets of PMOS transistors 205 as shown in FIG. 2. An array of circuits 200 act as described with regard to circuits 100 of FIG. 1 in that just a subset (such as just one) of circuits 200 is active at any given time in a normal mode of operation. Each circuit 200 includes one or more PMOS transistors 205 that have a common source node connected to a virtual VDD node 210. If a circuit 200 is active, the gate voltage Vg for its corresponding PMOS transistors 205 is either held low or is periodically switched low. However, if a circuit 200 is not active, its gate voltage is pulled to VDD. Virtual VDD 210 couples to actual VDD through PMOS transistors P1 and P2. P1 is the analog of M1 (FIG. 1) in that it is sized sufficiently to conduct the necessary current to PMOS transistors 205 in an active circuit 200. Because P1 is a PMOS transistor, its gate voltage $V_{\overline{ENABLE}}$ is the complement of the voltage $V_{enable}$ used to drive NMOS transistors 105 (should circuits 200 include such transistors, for illustration clarity they are not illustrated). In a standby mode of operation in which all circuits 200 are inactive, $V_{\overline{ENABLE}}$ is brought high. However, a gate voltage $V_{\overline{STANDBY}}$ for a P2 transistor is brought low in the inactive mode, where $V_{\overline{STANDBY}}$ is the complement of the voltage $V_{standby}$ used to drive NMOS transistors 105 (if included in circuits 200). P2 is a relatively weak transistor sized analogously as discussed with regard to N2 to provide a chokepoint for the leakage current that would otherwise flow through transistors 205. Because of the current flow through P2, virtual VDD will be slightly lower in potential than VDD in the inactive mode of operation. Because the gate voltage Vg applied to PMOS transistors 205 is true VDD (rather than virtual VDD), the gate-to-source voltage (Vgs) for PMOS transistors 205 is positive. A positive Vgs voltage for PMOS transistors 205 has the same effect of exponential leakage current reduction as does a negative Vgs voltage for NMOS transistors 105. In this fashion, the overall leakage current through PMOS transistors 205 in the standby mode is substantially reduced. Further reduction of the leakage current is available if both P1 and P2 are non-conducting in a deep sleep mode of operation analogously as discussed with regard to FIG. 1.

Figure 3:
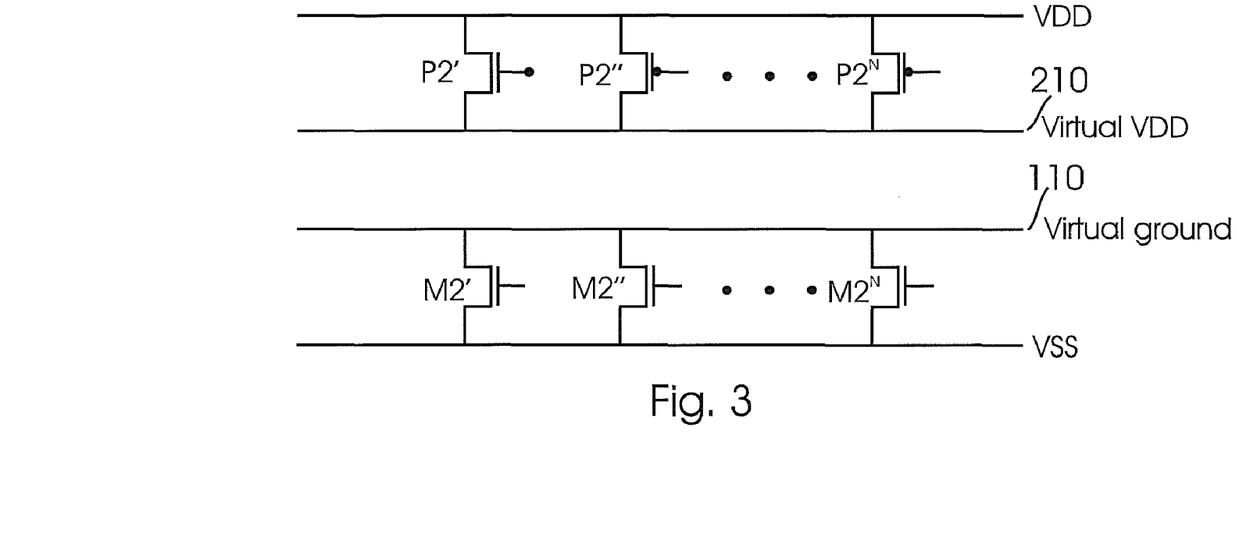
FIG. 3 is a circuit diagram of a virtual VDD node and a virtual ground node configurably controlled for leakage current reduction.

The tradeoff governing the desired size for transistors N2 and P2 may be affected by unpredictable or uncertain parameters. For example, leakage current may be affected by semiconductor process variability (fast or slow process corners), temperature, and other variables that cannot be predicted a priori. In turn, this unpredictability may complicate the design choice of how large transistors M2 and P2 should be to effect a desired tradeoff between leakage current reduction and recovery time necessary to begin a normal mode of operation. To ease this design choice, a series of selectable transistors N2' through $N2^N$ may be used in place of N2 and/or transistors P2' through $P2^N$ may be used in place of P2 as seen in FIG. 3. The standby control signals would then be coded such that a suitable subset of these transistors conducts in the standby mode. A controller (not illustrated) would determine the appropriate subset by selectively activating the transistors and determining whether the potential on virtual VDD 210 and virtual VSS 110 in the standby mode is appropriate in regard to a desired tradeoff between leakage current reduction and recovery time.

Further leakage current reduction may be obtained by organizing the array of circuits having its leakage current into groups of sub-arrays. For example, suppose circuits 100 comprise an array of 128 X-decoders. If a given X-decoder is active and the array is organized as discussed with regard to FIGS. 1 and 2, all the remaining X-decoders may leak despite not being used. However, if the X-decoders are arranged into sub-arrays, for example four sub-arrays of 32 X-decoders each, a given sub-array may be in the normal mode of operation while the remaining groups are in the standby or deep sleep mode, thereby reducing leakage current in the normal mode of operation. Moreover, each sub-array may have its own virtual ground and virtual VDD nodes as well. For example, turning now to FIG. 4, three sub-arrays 400-1 through 400-3 each have a virtual ground (elements 110-1 through 110-3, respectively), that couples to the sources of NMOS transistors (not illustrated) that require leakage current reduction. Each virtual ground 110-1 through 110-3 may be pulled low in a normal mode of operation by a corresponding NMOS transistor M1-1 through M3-1, respectively. Similarly, each virtual ground 110-1 through 110-3 couples through an NMOS transistor M2-1 through M2-3, respectively, to an NMOS transistor M3 controlled by the voltage $V_{standby}$. M3 thus functions as the analog of M2 in FIG. 1. Transistors M2-1 through M2-3 may either be tied to VDD as shown or tied to the inverse of the corresponding $V_{enable}$ signal.

Figure 5:
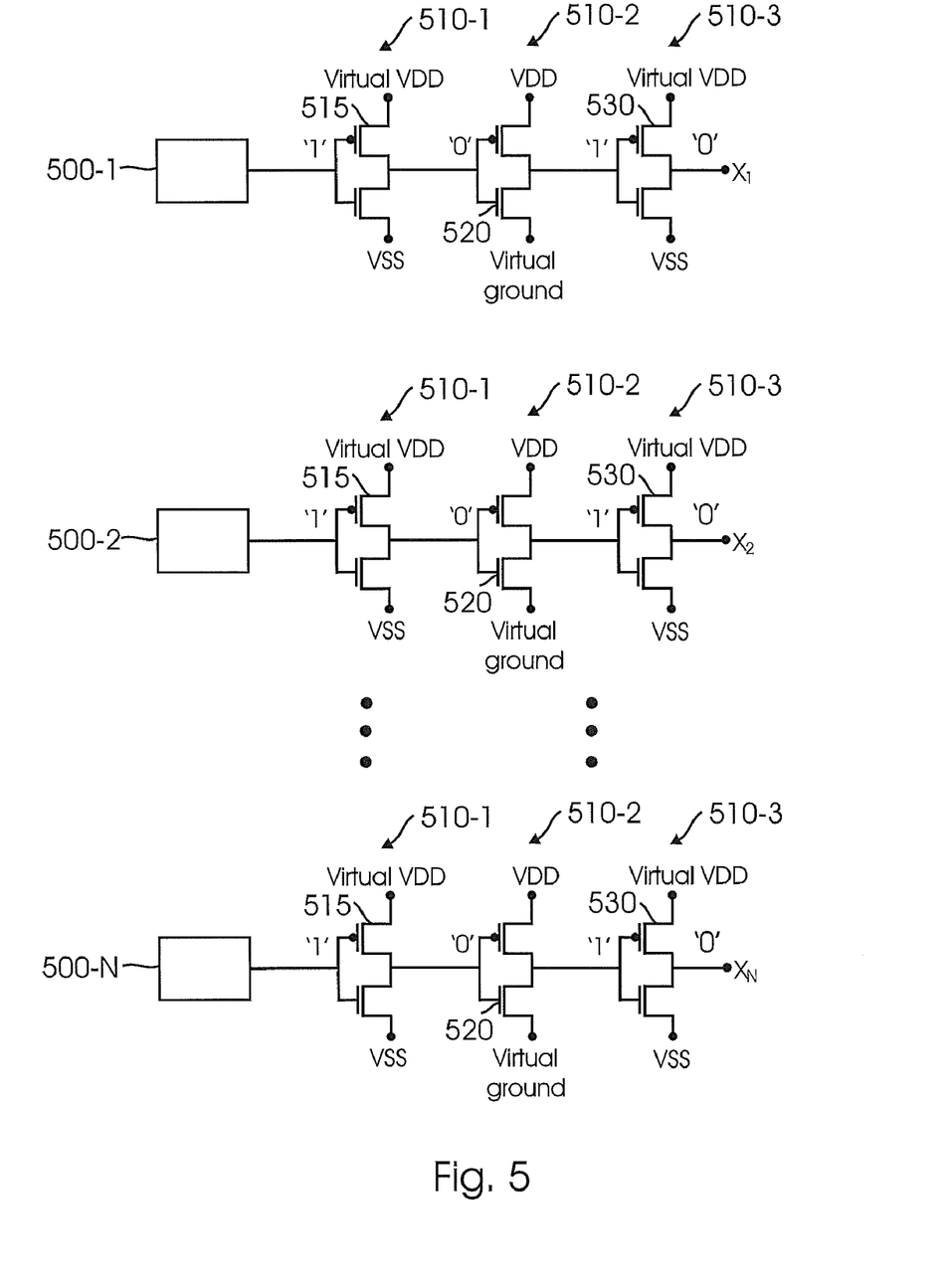
FIG. 5 is a circuit diagram of an array of X-decoders whose output stages are selectively coupled to a virtual VDD node and a virtual ground node for leakage current reduction.

In general, the larger the width a transistor 105 has as compared to a given length, the greater its leakage current will be. Thus, there may be a subset of NMOS transistors 105 that provide the great majority of the total leakage current. In that regard, the leakage reduction circuits and techniques disclosed herein may be applied to just such a subset of transistors and achieve substantially the same overall leakage current reduction. For example, turning now to FIG. 5, should circuits 100 comprise X-decoders 500, it is conventional for each X-decoder 500 to have relatively large (with regard to other transistors) transistors in its output stage comprised of CMOS inverters 510. For example, a first X-decoder 500-1 drives its output stages 510 to bring a corresponding word line X1 either high or low. Similarly, an nth X-decoder 500-n drives its output stages 510 to bring a word line XN either high or low. The states of CMOS inverters 510 are known if all word lines are inactive. Each stage 510 will have either a PMOS transistor or an NMOS transistor that is turned off but conducting leakage current. For example, a first stage 510-1 has its input driven high (corresponding to a logical '1') by its corresponding X-decoder. Thus, a PMOS transistor 515 in each first stage 510-1 may be conducting leakage current if its X-decoder is inactive. To prevent this leakage current, each PMOS transistor 515 has its source tied to a virtual VDD controlled, for example, as discussed with regard to FIG. 2. Similarly, each second stage 510-2 has its input driven low (corresponding to a logical '0') by the corresponding first stage. Thus, an NMOS transistor 520 may be conducting leakage current if its X-decoder is inactive. To prevent this leakage current, each NMOS transistor 520 has its source tied to a virtual ground controlled, for example, as discussed with regard to FIG. 2. Finally, each third stage 510-3 has its PMOS transistor 530 controlled as discussed for stage 510-1.

The leakage current reduction techniques described herein may be applied to two-dimensional arrays of memory circuits such as, for example, SRAM cells. In such arrays, it is conventional that only a single row is active at any given time. Thus, each column in such an array has the property that only a single memory cell will be active at any given time. Accordingly, each column in such an array may have its leakage current reduced in accordance with the techniques disclosed herein. For example, in an SRAM cell, if the virtual VDD and virtual ground nodes are not allowed to float too far from VDD and VSS, respectively, then the memory contents of the SRAM cell will be preserved in the standby mode. However, the memory contents will eventually be lost in the deep sleep mode.

Figure 6A:
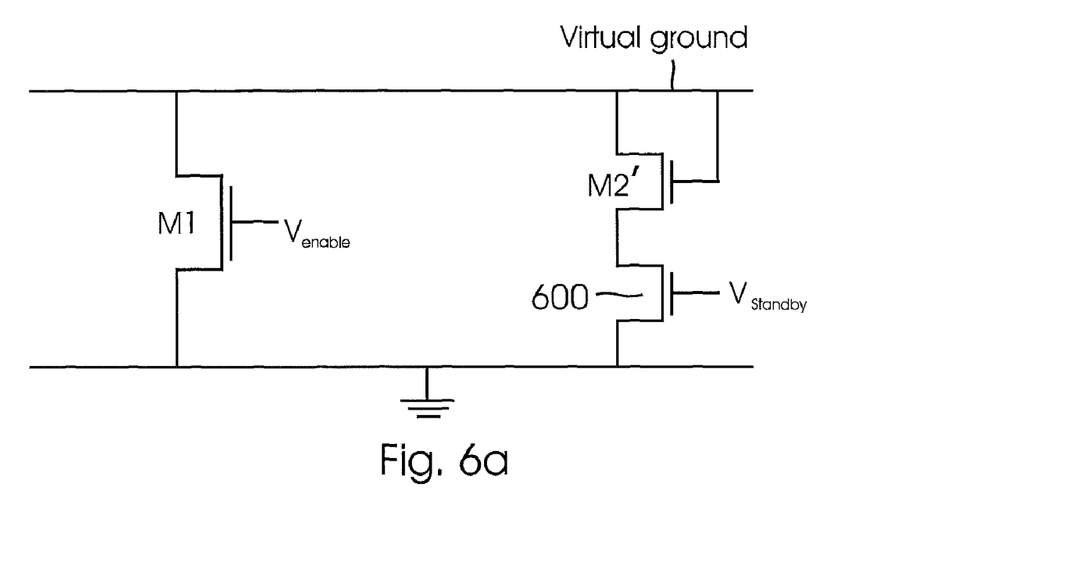
FIG. 6a illustrates a leakage reduction circuit in which transistor M2 is implemented using a diode-connected native NMOS transistor that does not directly couple to ground.
Figure 6B:
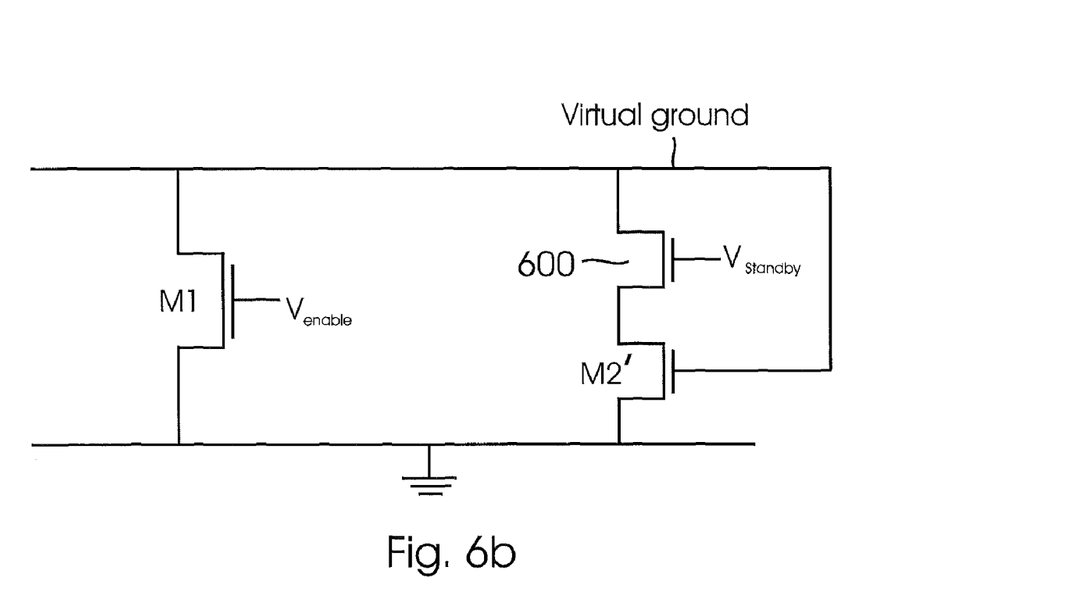
FIG. 6b illustrates a leakage reduction circuit in which transistor M2 is implemented using a diode-connected native transistor that directly couples to ground.

As discussed with regard to FIG. 3, process variations and other effects may make it difficult to predict in advance the particular size transistor best suited to serve as M2 or P2. For example, with regard to M2, it is desired to be weak such that it chokes the leakage current but yet not so weak that the virtual ground would raise too high in potential. Regardless of its size, transistor M2 cannot conduct until its threshold voltage Vt is exceeded. Once a non-native transistor such as M2 is conducting, the relationship between the current it conducts and Vds is substantially linear. In general, the Vt for a non-native transistor is approximately 0.3 V, which means the virtual ground must float up to this value before M2 conducts. However, should a process variation be such that the total leakage current being conducted through M2 is twice what is expected, the virtual ground could float to approximately 0.6 V given the linear relationship between current and voltage. Turning now to FIG. 6a, it may be seen that forming transistor M2 using a diode-connected native transistors M2' eases the design choice. A native transistor has its channel blocked or masked during the implant step that adjusts the threshold voltage for non-native transistors. In contrast to transistors with channel implants, an NMOS native transistor has a threshold voltage equaling approximately 0 volts. Moreover, the current is proportional to the square of the Vgs voltage in a native NMOS transistor. Thus, even if process variations cause an unexpectedly high leakage currents to flow through M2', the voltage change at the virtual ground will be less dramatic as compared to a non-native transistor embodiment. Because M2' is diode connected, it must be switched through a serial connection to a transistor 600 whose gate voltage is controlled by the $V_{standby}$ as discussed with respect to FIG. 2. Thus, when $V_{standby}$ is asserted, the standby mode of operation is enabled. An alternative native transistor embodiment is shown in FIG. 6b in which the native transistor is coupled between transistor 600 and ground. Such an arrangement is advantageous compared to the embodiment of FIG. 6a because the expected range of leakage currents is reduced.

Figure 6C:
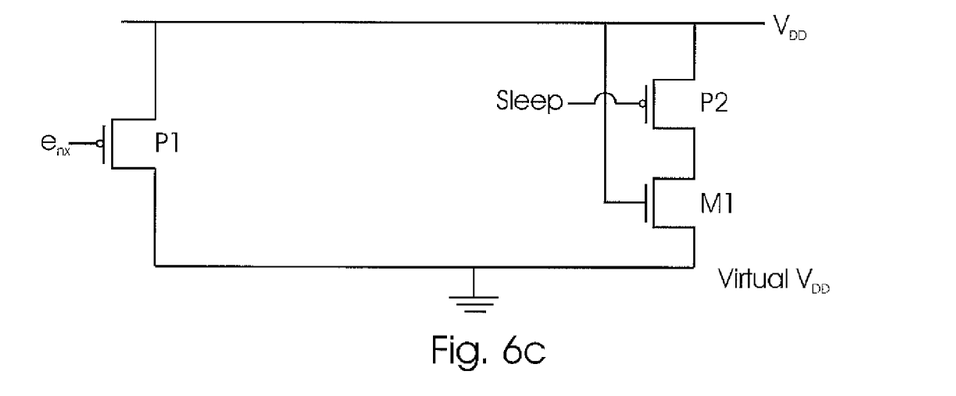
FIG. 6c illustrates a leakage reduction circuit for a virtual power supply node.

An analogous diode-connected NMOS native transistor also simplifies the design of a virtual power supply VDD node as illustrated in FIG. 6c. A relatively strong PMOS transistor P1 couples between a power supply node VDD and the virtual power supply node VDD. An active low enable signal enx controls the gate of P1 such that when enx is asserted (brought low), the virtual power supply VDD node can supply power to circuits (not illustrated) that are powered through a coupling to this node. In contrast, signal enx is de-asserted during a sleep mode such that leakage control occurs through a diode-connected native NMOS transistor M1. Transistor M1 has its source connected to the virtual power supply VDD node and its drain coupled to the drain of a PMOS transistor P2. An active low sleep signal controls the gate of transistor P2 such that when the sleep signal is asserted, the native transistor M1 may conduct through diode action since its gate is coupled to the power supply node VDD. In this fashion, the virtual power supply node VDD is kept slightly lower in potential than the power supply voltage VDD during the sleep mode while having the process variation resistance discussed with regard to FIGS. 6a and 6b. A deep sleep mode occurs when both enx and the sleep signals are high such that the virtual power supply node VDD may fall so low in voltage that any active devices powered through this node lose their necessary operating voltages.

Figure 4:
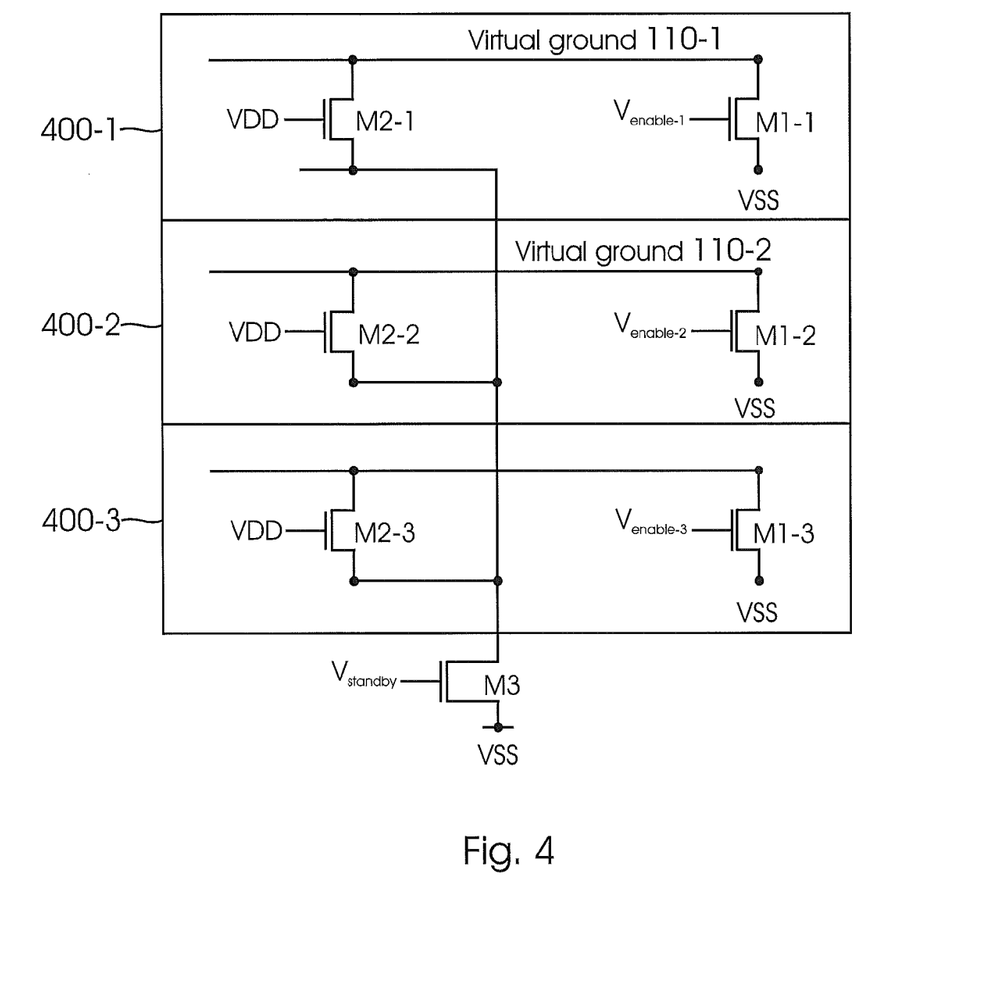
FIG. 4 is a circuit diagram of an array of sub-arrays, wherein each sub-array has a virtual ground controlled for leakage current reduction.
Figure 7:
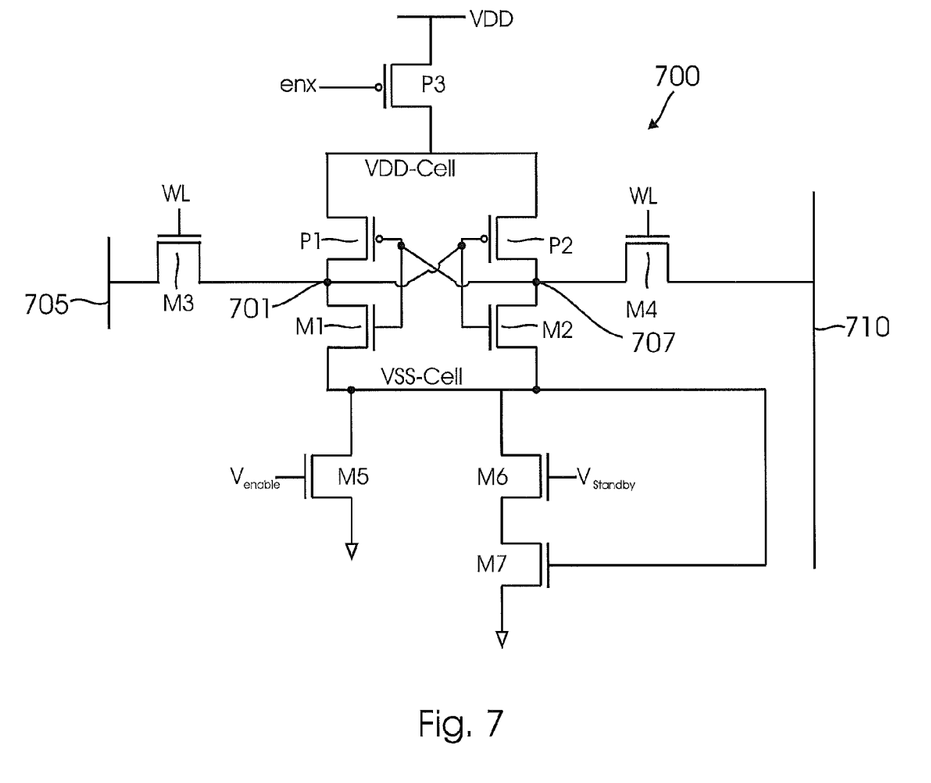
FIG. 7 illustrates an SRAM memory cell having a virtual ground node to control leakage.

The block-based leakage control discussed with regard to FIG. 4 leads to an advantageously simple control interface. For example, an array of SRAM cells may be arranged in sub-arrays, wherein the leakage in each array is controlled on a block-by-block (sub-array) basis. As known in the arts, each SRAM cell comprises a pair of cross-coupled inverters that couple to a bit line and a complement bit line through corresponding access transistors. Turning now to FIG. 7, an SRAM cell 700 thus includes cross-coupled inverters, where a first inverter comprises a PMOS transistor P1 that is coupled in series with an NMOS transistor M1. The second inverter comprises a PMOS transistor P2 that is coupled in series with an NMOS transistor M2. An output node between P1 and M1 couples though an access transistor M3 to a bit line 710. Similarly, an output node 707 between P2 and M2 couples through an access transistor M4 to a complement bit line 710. Consider the situation if node 701 is storing a logical one by being charged to a power supply voltage VDD such that complementary node 707 will be grounded. If a logical zero is to written into the cell, a word line (WL) coupled to the gate of access transistor M3 is activated while bit line 705 is grounded. M3 must then compete with P1 as to the voltage state of node 701. Thus, it is conventional to make M3 larger than P1 so that the memory cell may be "flipped" so as to change its binary state. Similarly, suppose the memory cell is storing a logical zero such that node 701 is grounded and a read operation is performed. The bit line 705 will be pre-charged and then allowed to float while the word line voltage is raised such that M3 conducts. Because of the pre-charge on the bit line, there is a danger that node 701 will be momentarily raised enough in voltage such that the memory cell changes its binary state. To prevent such an error during read operations, it is conventional to make M1 larger than M3. It may thus be seen that for a conventional SRAM cell, M1 and M2 represent the leakage problems since these transistors will be considerably larger than P1 and P2. To prevent this leakage, transistors M1 and M2 couple to a virtual ground (denoted as VSS_cell) as discussed previously. A virtual power supply node such as discussed with regard to FIG. 6c could also be implemented but is typically superfluous because of the relative sizes of P1 and P2 as compared to M1 and M2. As discussed with regard to, for example, FIGS. 6a and 6b, a relatively large transistor M5 is controlled by a $V_{enable}$ signal that is asserted during normal operation (which may be denoted as an active mode). M5 is sized so as to provide the necessary current such that SRAM cell 700 retains its binary state during normal operation in which read and write operations are expected. A signal enx controls a gate of a PMOS transistor P4 coupled between a cell power supply node VDD_cell and a power supply node VDD. The cross-coupled inverter PMOS transistors P1 and P2 have their sources tied to VDD_cell. Thus, during normal operation, enx is asserted low to power cell 700.

In contrast to normal operation, a standby mode for cell 700 is established if no read or write operations are expected but cell 700 should still retain its binary contents. To minimize leakage current during the standby mode, $V_{enable}$ is de-asserted to turn off M5 while a standby mode signal $V_{standby}$ and enx are both asserted. The mode signal $V_{standby}$ controls the gate of an NMOS transistor M6 that is coupled in series to a diode-connected native transistor M7. In this fashion, the diode-connected native transistor M7 controls the voltage of the VSS_cell node during the standby mode so as to prevent it from floating too high and destroying the binary contents of cell 700. However, the resulting negative Vgs on M1 or M2 (depending upon which node 701 or 707 is grounded) sharply reduces leakage current. It will be appreciated that M7 may be implemented as a non-native device depending upon how much voltage raise is tolerated at VSS_cell.

A deep sleep (power down) mode is established for cell 700 if enx is de-asserted (brought to VDD) while $V_{enable}$ and $V_{standby}$ are both de-asserted (brought low). Very little leakage occurs for such a mode although the binary contents of cell 700 will be lost. The leakage will be particularly minimized if P3 is constructed as a high Vt transistor or as an I/O transistor. Should an n-well for the memory array holding cell 700 be connected to VDD_cell, there will be very little p+/nwell diode leakage as well. A test mode may be enabled in addition to the active, standby, and deep sleep modes. In the test mode, all leakage control signals are turned off such that enx, $V_{standby}$, $V_{enable}$ are all asserted.

Figure 8:
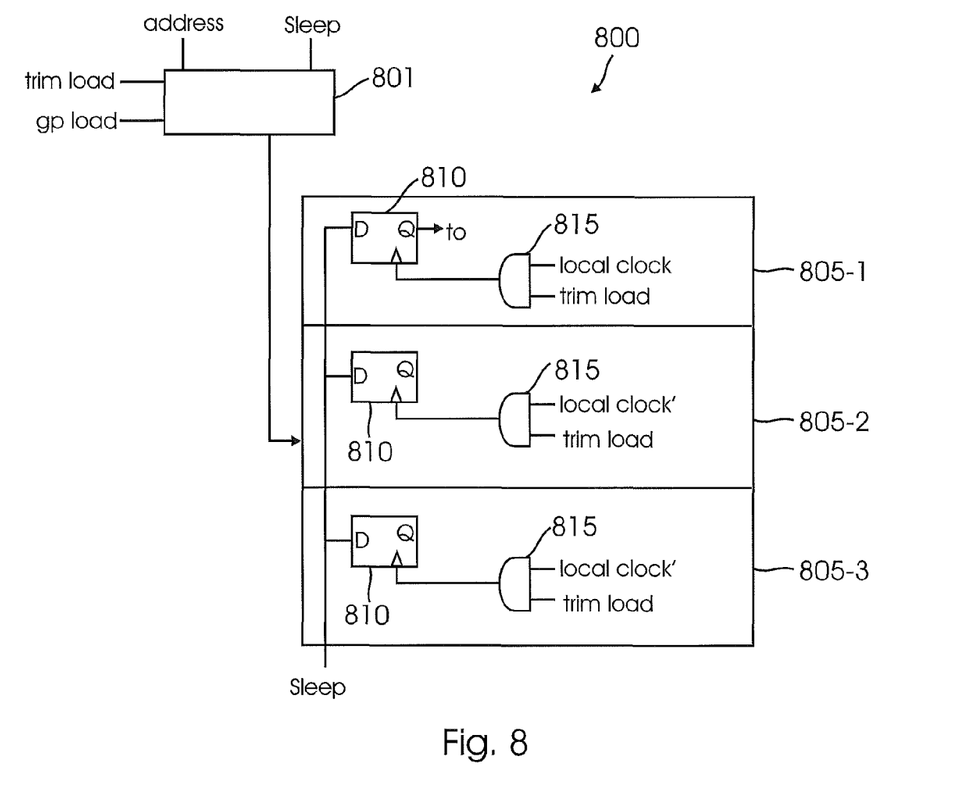
FIG. 8 illustrates a memory arranged into a plurality of sub-arrays having an access interface that controls the addressing of each sub-array as well as leakage control modes.

Turning now to FIG. 8, a memory 800 having a simple interface 801 is illustrated that uses the existing access interface for memory sub-arrays to control whether a given sub-array is active, in the low-leakage mode (standby mode), or in a deep sleep mode. Memory 800 includes three sub-arrays 805-1, 805-2, and 805-3. As known in the arts, an access interface 801 will decode an address so as to address a proper sub-array. When a sub-array is accessed, it will trigger the assertion of a local clock in the sub-array that controls the decoding and latching of a presented address. Suppose it is desired to place a given sub-array into the sleep mode. A sleep mode signal may be asserted that is provided to a register 810 within each sub-array. A normal access to sub-array 805-1 is generated (either a read or a write operation). In this fashion, only the local clock within the addressed sub-array is asserted. However, in addition to the normal access to 805-1, a sleep enable signal trimload is asserted. Each sub-array includes an AND gate 815 that provides the logical AND of its local clock and the trimload signal. Registers 810 are clocked by the output of the corresponding AND gate such that only the register within the accessed sub-array is clocked. For example, suppose it is desired to place sub-array 805-1 into the sleep mode. While an access operation (a dummy read or write operation to sub-array 805-1) occurs, sleep and trimload are asserted. Thus, only register 800 within sub-array 805-1 registers the sleep signal, which is stored within this register as its Q signal. Subsequent decoding circuitry (not illustrated) within each sub-array decodes the Q signal such that the proper control (assertion of enx and de-assertion of $V_{standby}$ and $V_{enable}$) occurs within the appropriate sub-array. A default mode for each sub-array would be the standby mode in which $V_{standby}$ is asserted while $V_{enable}$ is de-asserted. During an normal read or write access to a sub-array, interface 801 asserts $V_{enable}$ to allow normal operation in the accessed sub-array. To allow a universal sleep mode assertion for all sub-arrays, AND gate could receive an alternative signal to the local clock that represents a logical OR of the local clock and a universal sleep signal gpload. Thus, if trimload and gpload are both asserted, all the AND gates will trigger their corresponding registers to latch the sleep signal. It will be appreciated the simplicity of modifying an existing address interface as discussed above to provide interface 801. For example, regardless of the number of sub-arrays within the memory, just two signals (sleep and trimload) in conjunction with a normal access to a given sub-array control the assertion of the sleep mode.

The above-described embodiments of the present invention are merely meant to be illustrative and not limiting. It will thus be obvious to those skilled in the art that various changes and modifications may be made without departing from this invention in its broader aspects. Therefore, the appended claims encompass all such changes and modifications as fall within the true spirit and scope of this invention.

We claim:

1. A leakage reduction circuit, comprising:
   a virtual power supply node;
   a first PMOS transistor coupled between the virtual power supply node and a power supply node;
   a second PMOS transistor having a source coupled to the power supply node; and
   a native NMOS transistor coupled between a drain of the second PMOS transistor and the virtual power supply node, the native NMOS transistor having a gate driven by the power supply node.

2. The leakage reduction circuit of claim 1, further comprising at least one leaking transistor powered by the virtual power supply node, wherein a gate for the first PMOS transistor is controlled by a normal mode signal asserted during normal mode operation of the at least one leaking transistor.

3. The leakage reduction circuit of claim 2, wherein a gate of the second PMOS transistor is controlled by a standby mode signal asserted during standby mode operation of the at least one leaking transistor.

4. The leakage reduction circuit of claim 3, wherein the at least one leaking transistor comprises a CMOS inverter.

* * * * *